United States Patent [19]

George et al.

[11] Patent Number: 4,812,217

[45] Date of Patent: Mar. 14, 1989

[54] METHOD AND APPARATUS FOR FEEDING AND COATING ARTICLES IN A CONTROLLED ATMOSPHERE

[75] Inventors: Carroll H. George, Norwood, N.Y.; Ray D. Rust, Berkeley Heights, N.J.

[73] Assignee: American Telephone and Telegraph Company, AT&T Bell Laboratories, Murray Hill, N.J.

[21] Appl. No.: 42,508

[22] Filed: Apr. 27, 1987

[51] Int. Cl.⁴ ............................................. C23C 14/00
[52] U.S. Cl. .............................. 204/192.12; 204/298; 118/724; 118/716
[58] Field of Search ............... 204/298, 192.1, 192.12, 204/298 MM, 298 MC, 298 SC; 118/724, 718; 414/217

[56] References Cited

U.S. PATENT DOCUMENTS

| | | | |
|---|---|---|---|
| 2,146,025 | 5/1939 | Penning | 250/27.5 |
| 3,779,885 | 12/1973 | Labedan et al. | 204/298 |
| 3,852,181 | 12/1974 | Cirkler et al. | 204/298 |
| 3,856,654 | 12/1974 | George | 204/298 |
| 3,891,536 | 6/1975 | Glaser et al. | 204/298 |
| 4,175,030 | 11/1979 | Love et al. | 204/298 |
| 4,194,962 | 3/1980 | Chambers et al. | 204/298 |
| 4,239,611 | 12/1980 | Morrison, Jr. | 204/298 |
| 4,265,729 | 5/1981 | Morrison, Jr. | 204/298 |
| 4,351,697 | 9/1982 | Shanefield et al. | 156/643 |
| 4,394,236 | 7/1983 | Robinson | 204/298 |
| 4,426,275 | 1/1984 | Meckel et al. | 204/298 |
| 4,444,848 | 4/1984 | Shanefield et al. | 428/624 |
| 4,486,289 | 12/1984 | Parsons et al. | 204/298 |
| 4,501,225 | 2/1985 | Nagao et al. | 118/724 |
| 4,576,700 | 3/1986 | Kadokura et al. | 204/192.15 |
| 4,580,619 | 4/1986 | Aitken | 118/724 |

OTHER PUBLICATIONS

New West Modular System Features Announcement Sheet.

Primary Examiner—John F. Niebling
Assistant Examiner—Steven P. Marquis
Attorney, Agent, or Firm—Alfred G. Steinmetz

[57] ABSTRACT

A process and apparatus for cleaning then coating articles such as circuit board panels with a metallic coating encompasses an enclosed evacuated chamber having a controlled low pressure gaseous process environment. The articles to be cleaned, then coated with a metallic deposit are continuously fed into the enclosed chamber through an air lock mechanism that permits the evacuated chamber to remain at its predetermined pressure and gaseous composition. Included within the chamber are a plurality of transport paths or panel carrying tracks. The articles to be cleaned, then coated are continuously transported along the various tracks while being coated.

The plurality of tracks are positioned to be substantially parallel with each other so that articles on each track follow paths similar in direction and substantially equidistant from one another. A plurality of bidirectional coating sources are sequentially positioned on both sides of each article transport track so that both sides of the panels are coated.

22 Claims, 11 Drawing Sheets

METHOD AND APPARATUS FOR FEEDING AND COATING ARTICLES IN A CONTROLLED ATMOSPHERE

FIELD OF THE INVENTION

This invention relates to apparatus for and a method of continuously transporting articles through a low pressure chamber with controlled atmosphere and performing a cleaning thereof and then a coating of the articles with a desired material while in the chamber. It is particularly concerned with apparatus for and a method of continuously transporting articles by way of a plurality of adjacent paths each including cleaning facilities coupled with a continuous coating process. In this process articles are cleaned, then coated with a specified material by bidirectional sources which service adjacent article transport paths along which articles are continuously transported.

BACKGROUND OF THE INVENTION

Articles including electrical or electronic components such as integrated circuits, hybrid components and printed circuit boards require the deposit of a metallic film or surface coating at some point in their manufacturing process. At present the application of metallic coatings to printed circuit boards is normally performed by wet chemical processing. The processing is a continuous process however it normally involves the handling of toxic chemicals. Recently dry metallization techniques such as sputtering, vapor deposition and ion plating have been shown to satisfy coating adhesion requirements and accordingly can be utilized for practical commercial use.

In the integrated and hybrid circuit industries a variety of materials such as gold, palladium, copper, aluminum, tantalum or tantalum nitride may be deposited on ceramic or silicon substrates by a sputtering process. In the printed circuit industry copper is the typical metallic film. Once the film is deposited it can be increased in thickness, etched or otherwise fabricated into the circuits and/or components.

For a aputtering process a target of the material to be sputtered is attached to the face of the cathode. This target material is subjected to a high cathodic voltage in an inert low pressure gaseous atmosphere, such as argon, where the gas is ionized to bombard the exposed metallic surface and dislodge atoms or clusters of atoms which are subsequently deposited on the substrate.

Many dry metallization manufacturing facilities have been developed for depositing thin films of metal on substrates. In one type of continuous single line, open end apparatus the substrates are advanced through a series of individually pumped chambers of successively reduced pressure until the substrates enter a vacuum chamber where the sputtering takes place. In another type of continuous sputtering apparatus a group of substrates are advanced through a series of locks which are successively evacuated and then the substrates enter a vacuum process chamber to receive the sputter deposit. Even the sputtering of a relatively thin film takes considerable time; hence, these types of one dimensional linear facilities are necessarily slow because so few substrates are being sputtered at a time.

In batch bell jar apparatus, cylindrical arrangements of the substrates have been utilized to increase the number of substrates that are simultaneously being processed. In this arrangement substrates are positioned within a bell jar in a circular array about a centrally disposed cathode so that all substrates are simultaneously processed. This process does not lend itself to continuous operation in that the bell jar has to be sequentially vented and pumped down for each batch of processed substrates. Further, in this process, substrates can be quite large (the substrates which are used for printed circuits can be 18"×24" or larger) and are of a planar construction. These substrates receive nonuniform deposits of metal; more being deposited in the center area of each substrate due to the closer proximity of the central area to the centrally disposed cathode.

An apparatus superior to the two previously mentioned devices in throughput and purity of the deposited film is the continuous cylindrical sputtering machine of U.S. Pat. No. 3,856,654. In this configuration the substrates are batch loaded then fed in a continuous single circular line around a centrally disposed cathode. The controlled atmosphere coating chamber is never exposed to the natural atmosphere during the coating operation which allows for a higher purity of deposit. Although the throughput of this apparatus is greater than any of the previously mentioned devices, it still operates on a one dimensional basis with a single line of substrates moving past the cathode.

While the dry metallization processes avoid the problem of toxic chemicals, they have at best limited continuous throughput capability and are most often realized in batch processing arrangements. At best when processing both sides of a substrate a single processing chamber whether continuous or batch operated can only accommodate a single throughput line.

BRIEF SUMMARY OF THE INVENTION

Therefore a process and apparatus for cleaning then coating articles such as circuit board panels with a metallic coating encompasses an enclosed evacuated chamber having a controlled low pressure gaseous process environment. The articles to be cleaned, then coated with a metallic deposit are continuously fed into the enclosed chamber through an air lock mechanism that permits the evacuated chamber to remain at its predetermined pressure and gaseous composition. Included within the chamber are a plurality of transport paths or panel carrying tracks. The articles to be cleaned, then coated are continuously transported along the various tracks while being coated.

The plurality of tracks are positioned to be substantially parallel with each other so that articles on each track follow paths similar in direction and substantially equidistant from one another. A plurality of bidirectional coating sources are sequentially positioned on both sides of each article transport track so that both sides of the panels are coated.

In the case of inner tracks, a single row of bidirectional coating sources located intermediate to two adjacent tracks serves as a coating source for facing panel sides of the articles on both adjacent tracks. Each individual coating source may be paired with a cooling sink, if needed, to limit the coated articles' temperature and together form individual stations with all stations being positioned sequentially along each side of an article transport track. Magnetic field apparatus associated with each station controls the trajectory of electrons which produce the ions that strike the metallic target. The magnetic field apparatus generates a magnetic flux whose line of flux are substantially parallel to the surface of the article being coated in a region substantially to that surface. This advantageously reduces the number of high energy electrons striking the surface and hence reduces the heat generated at the surface of the article being processed. A majority of sputtered metallic atoms emitted from the target are optimized so that their trajectory intersects an adjacent side of an article passing by on the transport track. The cooling sources, if needed, prevent an undue increase in temperature of the article being coated. The coated articles are continuously removed from the transport tracks through a terminus of air lock mechanism.

DETAILED DESCRIPTION

Figure 1:
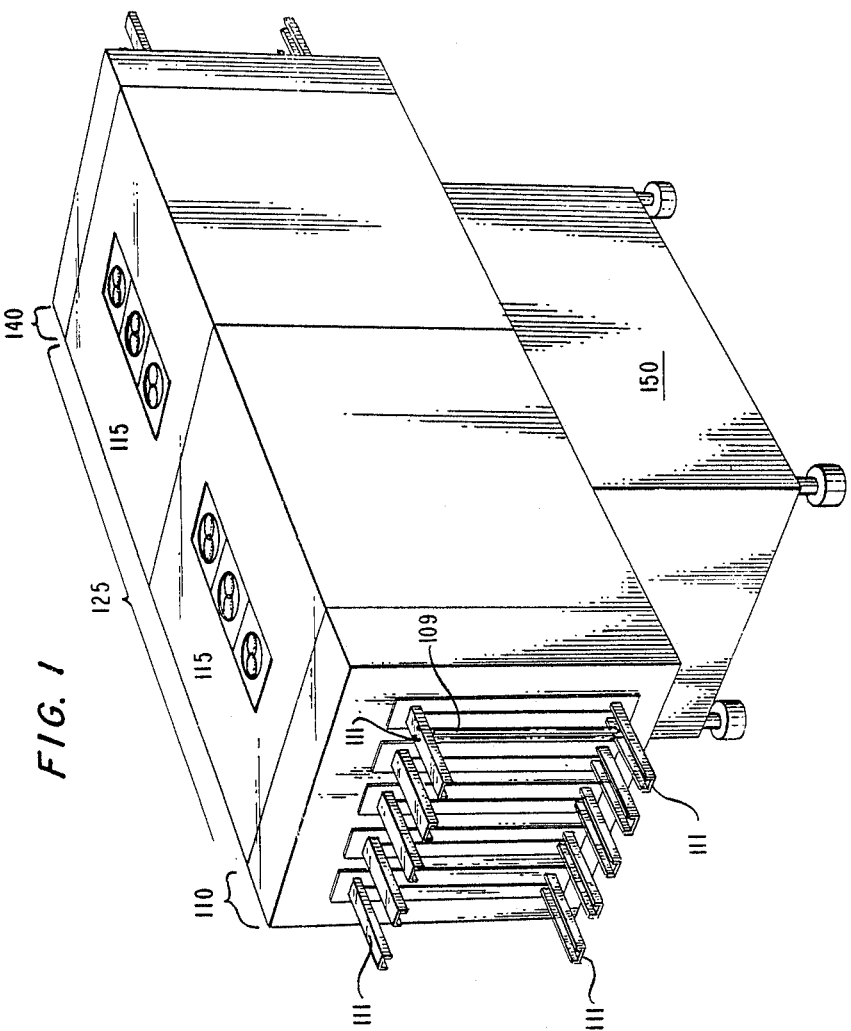
FIG. 1 is a perspective view of the article coating system embodying the principles of the invention.

A processing system apparatus for coating articles such as circuit panels is disclosed in FIG. 1. The overall chamber supports a processing system which uses sputtering techniques for metallically coating circuit panels, including surfaces of through holes within the panels, within a processing chamber with a controlled gaseous atmosphere. This coating process is performed as a continuous process with the panels to be coated being continuously transported through the processing chamber.

As shown in FIG. 1 the system includes a first dynamic air lock 110 which accepts panels to be coated on any of the five parallel panel input tracks 111. This input air lock 110 includes driving rollers 109 and feeds panels on the input tracks 111 into a processing chamber 125 which has a controlled atmosphere suitable for sputter deposition of metallic material. The air lock is preferably arranged so that panels may continuously pass through without significantly degrading the controlled atmosphere. A suitable continuous air lock arrangement for this application is shown schematically in FIG. 16 and is disclosed in detail in a copending application filed simultaneously on Apr. 4, 1987 with the present application by George, Lynott and Pargellis and having Ser. No. 042,507. Other dynamic type air locks maybe utilized.

A suitable illustrative controlled atmosphere for the processing chamber would be an argon gas at 5 mT (milli Torrs or $10^{-3}$ milimeters of mercury), although other suitable gases and pressures will suggest themselves to those skilled in the art. This controlled atmosphere is uniform throughout the entire processing chamber.

The processing chamber 125 as shown in FIG. 1, includes a sputter cleaning section comprising a bidirectional magnetron coating source and an etch screen at the beginning of each panel transport track within the chamber. Each sputter cleaning section simultaneously generates neutralized atoms to sputter clean panel surfaces and furthermore deposits a metallic coating thereon as panels pass by on a transport track. A series of subsequent deposition sections each include bidirectional magnetron coating sources for depositing a metallic coating (copper in the illustrative embodiment) on both sides of circuit panels continuously fed through the process chamber 125 on the transport tracks 111. The panels that are coated are removed from the processing chamber 125 through a subsequent dynamic air lock 140.

The entire processing system including the air locks 110 and 140 and the processing chamber 125 is mounted on a supporting member 150 which provides a structural mounting for the processing system and also includes control circuits, exhaust, water manifolds, and vacuum pumping apparatus to control an atmosphere within the process chamber 125 and air locks 110 and 140. Located on the top of the processing chamber 125 are air cooling fans 115, which are used to supply forced air cooling of the chamber's surface. Air flow is through cooling ducts external to the chamber and internal to the outer cover panels of the chamber shown in FIG. 1.

Figure 2:
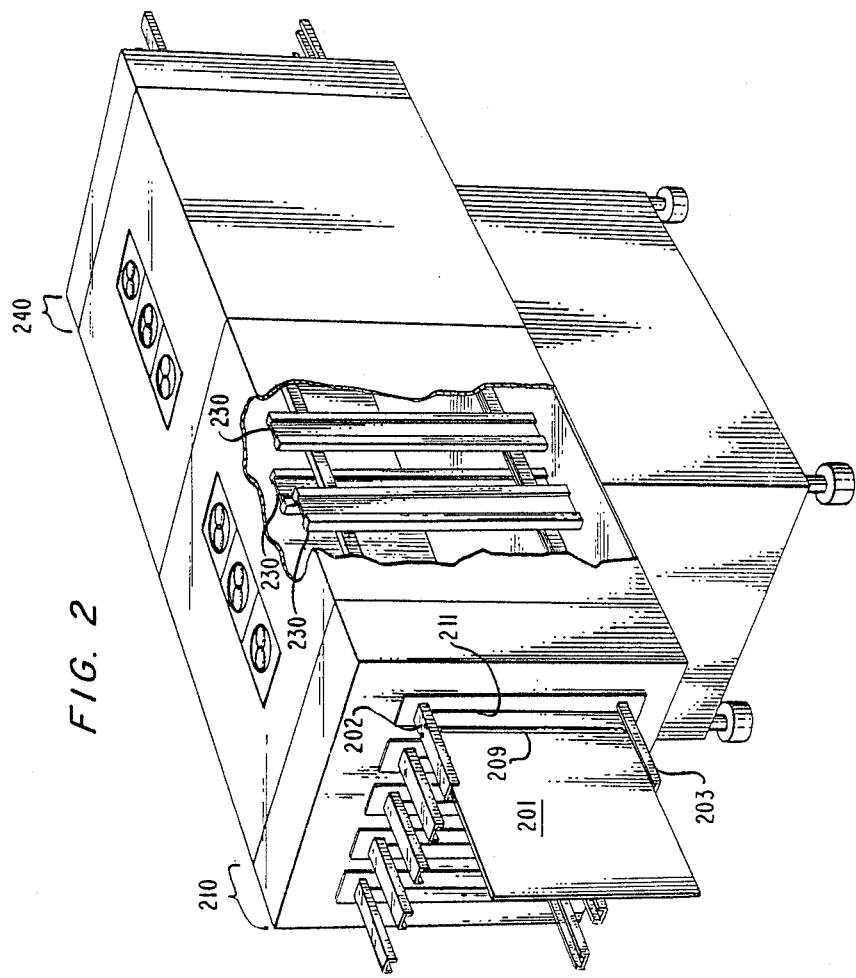
FIG. 2 is a cut away perspective view of the article coating system of FIG. 1 specifically showing a portion of one of the article processing transport paths within the processing chamber.

A cutaway view of the processing system of FIG. 1 is shown in FIG. 2 in which a processing section within the processing chamber associated with the first one of the panel transport tracks has been exposed to view. A circuit panel 201 is shown positioned on and held in place by upper and lower transport track guide 202 and 203 at the input to the dynamic air lock 210. Transport track guides 202 and 203 engage top and bottom edges of the panel 201 and guide it into the dynamic air lock 210.

Drive to the panel is supplied by the rollers 209 which physically connect the opposing surfaces at panel 201. An inlet lip seal 211 at the dynamic airlock 210, which forms an air tight seal around the sides and edges of the panel as it enters the air lock. The inlet lip seal 211 is substantially circular in cross section and is arranged to apply sealing pressure against the side of the panel and further includes provision to permit rotation of the seal itself so that little or no drag is applied to the panel as it enters the air lock. Following the lip seal is an air pumping arrangement within the air lock 210 to further seal and lower the gaseous pressure. Further included within the air lock 210 are chevron style sealing flaps which further assist in maintaining a pressure differential between the input and the output of the differential pumping station. This air lock mechanism is discussed in detail in the copending application of George, Lynott and Pargellis is also discussed below and is shown in a planar view in FIG. 16.

Within the process chamber just subsequent to air lock 210 is a magnetron actuated etching or cleaning station (not shown in FIG. 2) which includes a neutralizing screen to neutralize emitted ions which in turn strike and hence clean the panels passing by through particle bombardment. This etching station is discussed below in detail with reference to FIG. 7. These etching stations are located at the beginning of and on both sides of the panel transport tracks. The subsequent positioning of magnetron coating units 230 are shown on either side of the single panel transport track in the cut away view.

Cooling stations (not shown in FIG. 2) are located along both sides of the panel transport interspersed between the magnetron units 230 in a distributed fashion. A cooling station includes a water cooled plate and a flexible heat conducting surface which is spring loaded so as to ride on the surfaces of the circuit panel as it passes by. Details of such a cooling station are related below with reference to FIG. 8.

Figure 3:
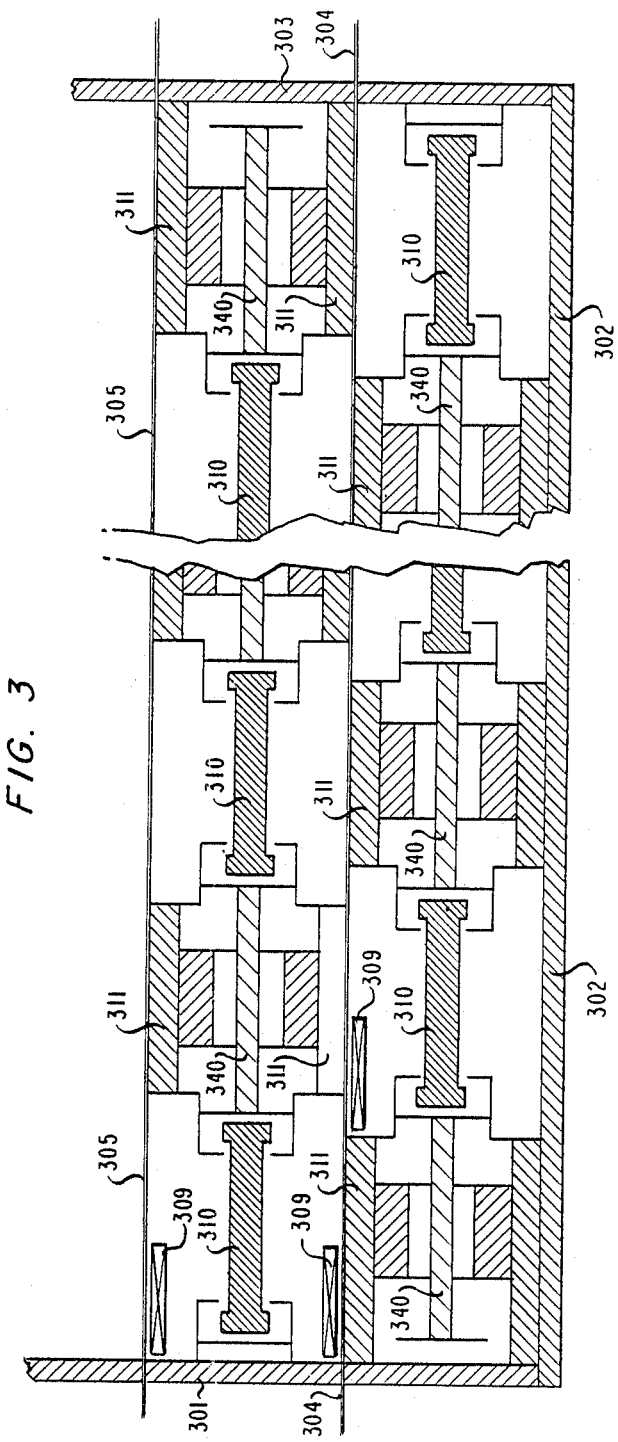
FIG. 3 is a partial plan view schematic showing various article transport paths within the process chamber and the associated cleaning, coating, and cooling stations.

A partial plan view of a horizontal cross section of the processing apparatus with the evacuated processing chamber is shown in FIG. 3. Three chamber walls 301, 302 and 303 of the process chamber shown (the fourth wall is not shown) substantially enclose two panel transport tracks 304 and 305 which represent two of the five tracks shown in FIG. 1. These tracks penetrate the end wall 301 when they exit the air locks (210 shown in FIG. 2) which are not shown in FIG. 3 and enter an air lock (240 shown in FIG. 2) after passing through wall 303.

Magnetron units 310 and cooling station units 311 are positioned alternately opposite each other on opposite sides of the transport track 304. On any side of any transport track magnetron coating units 310 and cooling station unit 311 alternate with one another. Each cooling station has a source of magnetic flux 340 associated with it which is operative when combined with the magnetic flux generated by the magnetron coating units 310 to maintain a composite magnetic flux parallel to the surface of the panel being coated in the region immediately adjcent to the panel surface. This pattern of coating and cooling unit is repeated constantly within the entire processing area of the evacuated processing chamber except that the first station with a magnetron unit along each transport track is a magnetron cleaning and etching station characterized by including a screen grid 309. Such a screen grid unit is shown in detail in FIGS. 8 and 9.

Figure 4:
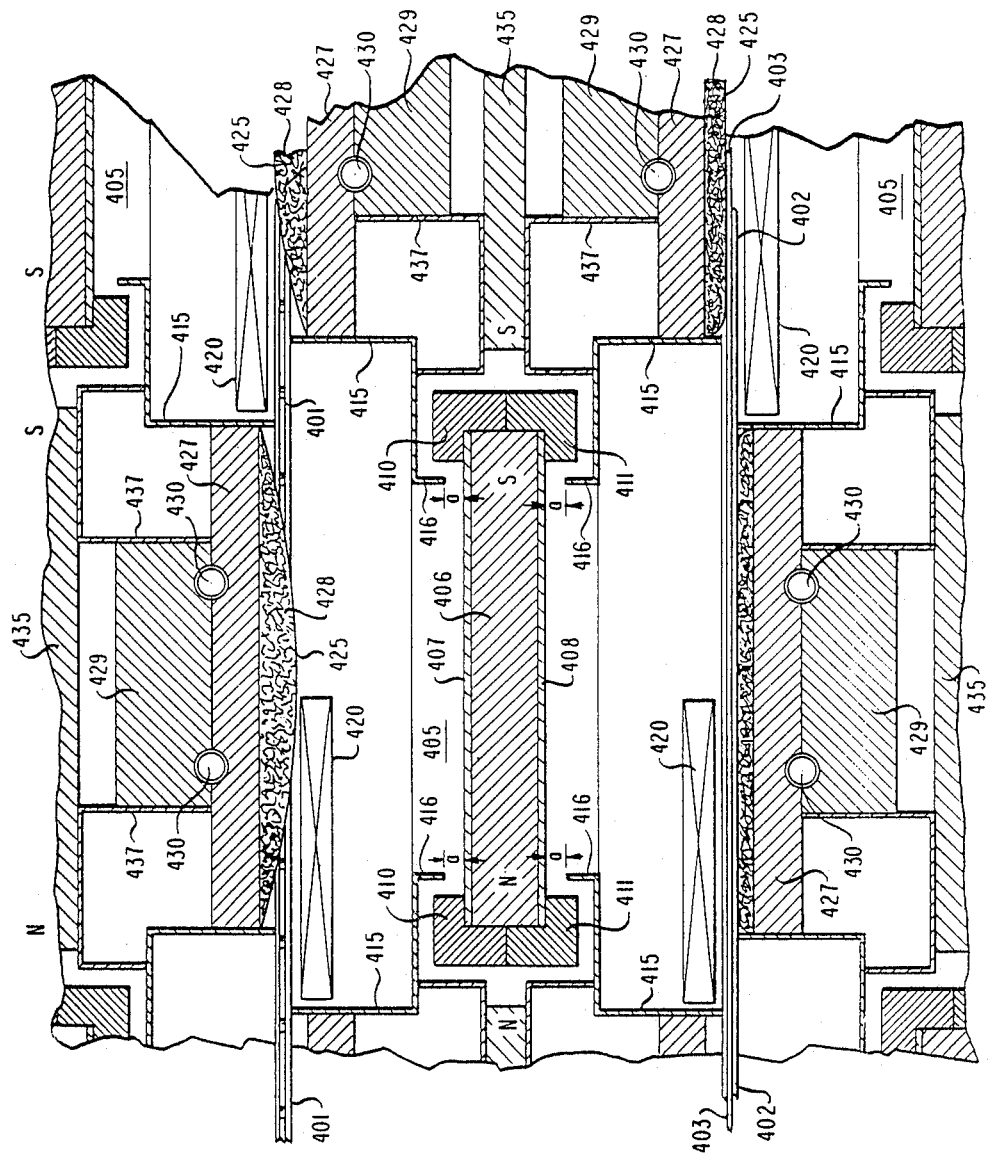
FIG. 4 is a fragmentary magnified portion of the plan view schematic of FIG. 3.

A more detailed fragmentary plan view of the processing chamber component structure showing details of the processing units is shown in FIG. 4. Two panel transport tracks 401 and 402 are shown with track 401 shown empty and track 402 including a panel 403 being processed. Centrally located in the view is a magnetron unit 405 which includes a plurality of permanent magnets 406 located in the interior of the magnetron unit. Two target plates 407 and 408 of the desired coating material are positioned on opposite sides of the magnets 406. End clamps 410 and 411 of soft iron are positioned to secure the structure together and to partially control the magnetic field generated by the magnets. Dummy magnets 435 located behind the cooling stations and in line with the magnetron magnets 406 are arranged so as to oppose the magnetic field of the adjacent magnetron 405. As shown in FIG. 4 the polarity of dummy magnets 435 are in an opposing direction to the magnets 406 of the magnetron units 405. Their presence is included to generate a resulting flux whose lines are parallel to the surface of the panel being coated in the immediate vicinity of that surface. This particular arrangement limits the number of high velocity electrons striking the surface of the article and hence reduces the heat generated in the panel.

Positioned closely adjacent to each magnetron is a combination sputter shield/anode 415 which is grounded so as to be positive with respect to a negative potential of the targets 407 and 408. A lip 416 of the sputter shield/anode 415 is located physically close (dimension 'a' is approximately $\frac{1}{4}$") to the magnetron 405 to shield its end clamp/keepers 410 and 411 from sputtering ions and to provide control of electron paths to keep operating components cooler then is normally attained in such a process. Its potential (ground but positive with respect to the targets) is also effective in controlling a desired trajectory of electrons striking the target.

Located within the shield 415 and between the target 407 and 408 and the tracks 401 and 402, respectively are the sputter etching screen grids 420 which are included within initial magnetron units used for sputter cleaning and etching nearest the entrance air lock. These screen grids 420 are charged negatively to attract ions and are operative to neutralize the charged ions as they pass through the screen and then strike the adjacent surface of panels 403 passing by the tracks 401 and 402. Those atoms effect a cleaning action of the panel surface by striking it and causing contaminants to be dislodged therefrom.

Located adjacent to the tracks 401 and 402 and opposite the magnetron 405 are the cooling surfaces 425 which are attached to cooling plates 427. A fine fiber mat of brass wool 428 provides a thermal contact between the cooling plates 427 and the cooling surfaces 425 and also supplies a resilient force to cause the cooling surface to tactically contact panels passing by on tracks 401 and 402. Since the track 401 as shown has no panel inserted, the adjacent cooling surface 425 has assumed a relaxed quasi parabolic shape. The cooling surface 425 contacting the panel 403 on track 402 is shown with a flattened contour which permits it to tactically contact a substantial area of the panel 403.

Cooling action to the cooling plate 427 is provided by water tubes 430 which are positioned in indents cut jointly into the cooling plates 427 and an adjacent support column 429 utilized to support a roof of the process chamber. These cooling tubes 430 may be individually supplied for each individual column 429 or may be a single series multiply looped tube extending the length of the chamber and successively passing through the indents of each successive column 429.

Located behind the support column 429 are additional magnetic field or dummy control magnets 435 as described previously which are utilized in combination with the magnets 406 of the magnetron to control the magnetic flux to be parallel to both adjacent surfaces of the panels 403 transported on the tracks 401 and 402 in the region adjacent to these surfaces. This flux control is operative to minimize heating of the panel 403, and involves aligning opposing magnetic poles as shown in FIG. 4. Aluminum spacers 437 are positioned at ends of the support columns and are mounting supports for the control magnets 435.

Figure 5:
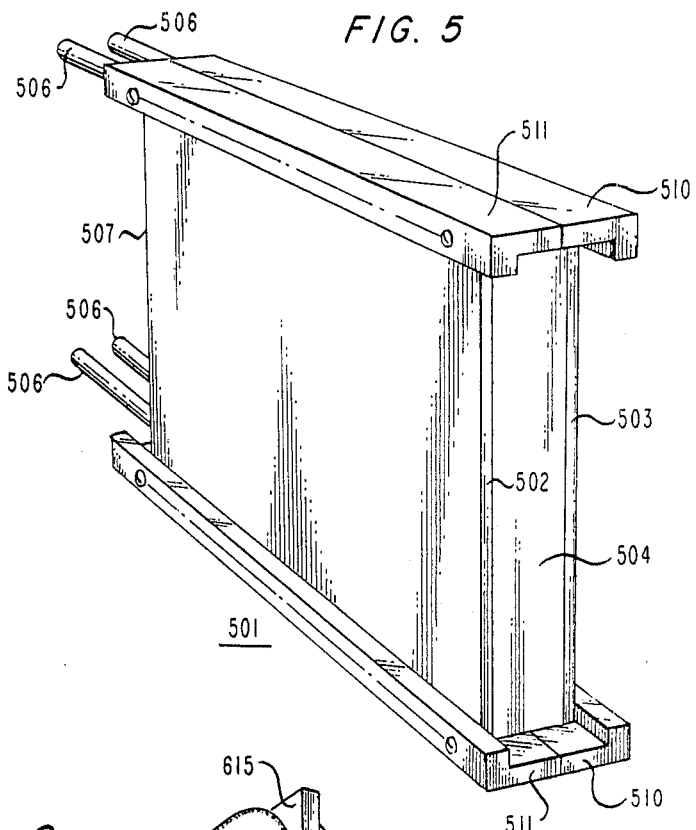
FIG. 5 is a perspective view of a bidirectional coating source included in the process chamber of the coating system.

An individual magnetron unit 501 is disclosed in FIG. 5 and includes a first target 502 and a second target 503 (whose target surface is not shown in the view) on a side opposite the first target. Between the two targets 502 and 503 are located magnets and cooling tubes all located between an end target surface 504 at the bottom and a top end target 507 (not shown). The cooling tubes 506 which carry a flow of a cooling gas or liquid, which may be water, are shown protruding from the top of the unit where they are connected to external cooling liquid or water sources.

This assembly including the three targets as well as target 507 not shown opposite end target 504 is clamped together by means of the end clamps 510 and 511. These clamps are made of soft iron to contain the magnetic field at the sides of the targets.

Figure 6:
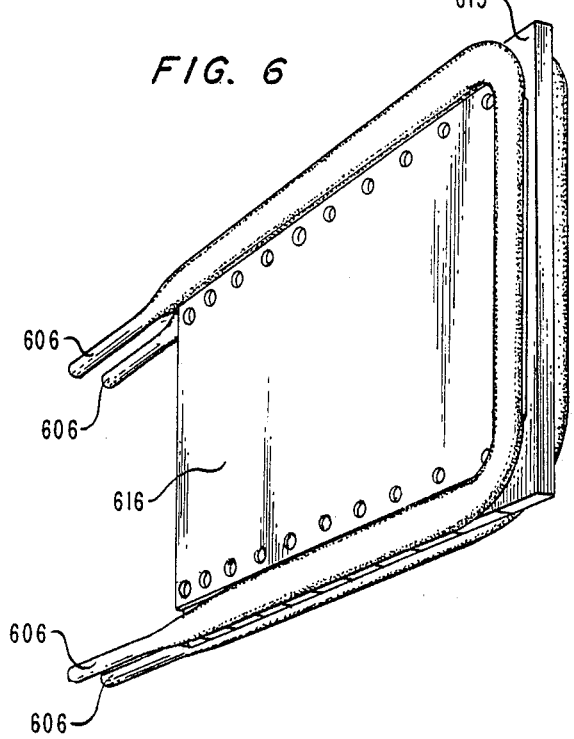
FIG. 6 is a perspective view showing an internal portion of the coating soruce illustrating a cooling mechanism to remove heat from the coating source.
Figure 7:
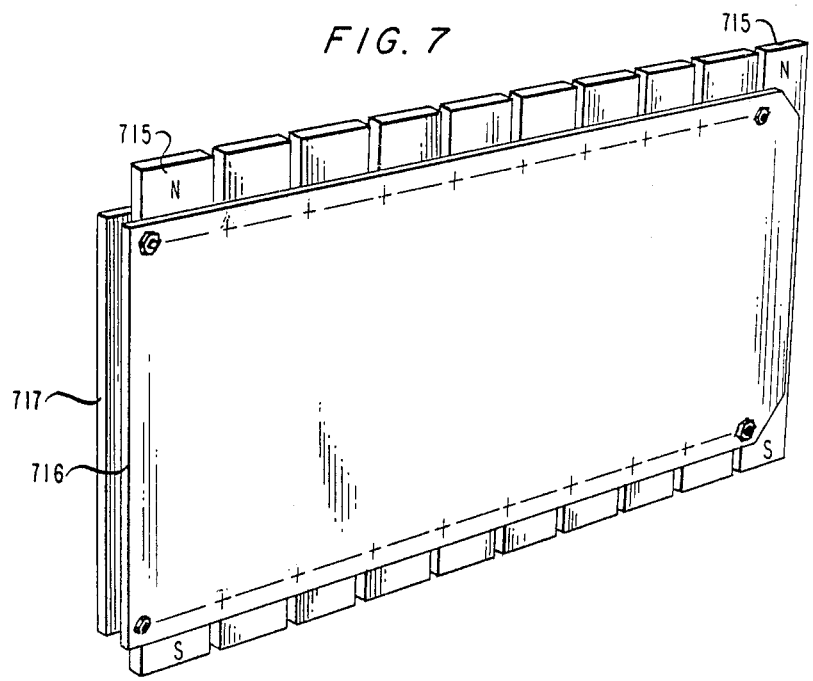
FIG. 7 is a perspective view showing an internal portion of the coating source showing in particular magnetic inserts to generate the desired magnetic field.

The inner assembly is shown in FIG. 6 where the internal positioning of the cooling piping 606 is shown on either side of the clamped magnets 615 held in place by clampling plates 616. In FIG. 7 the clamped magnets 715 are shown more clearly secured between clamping plates 716 and 717.

Figure 8:
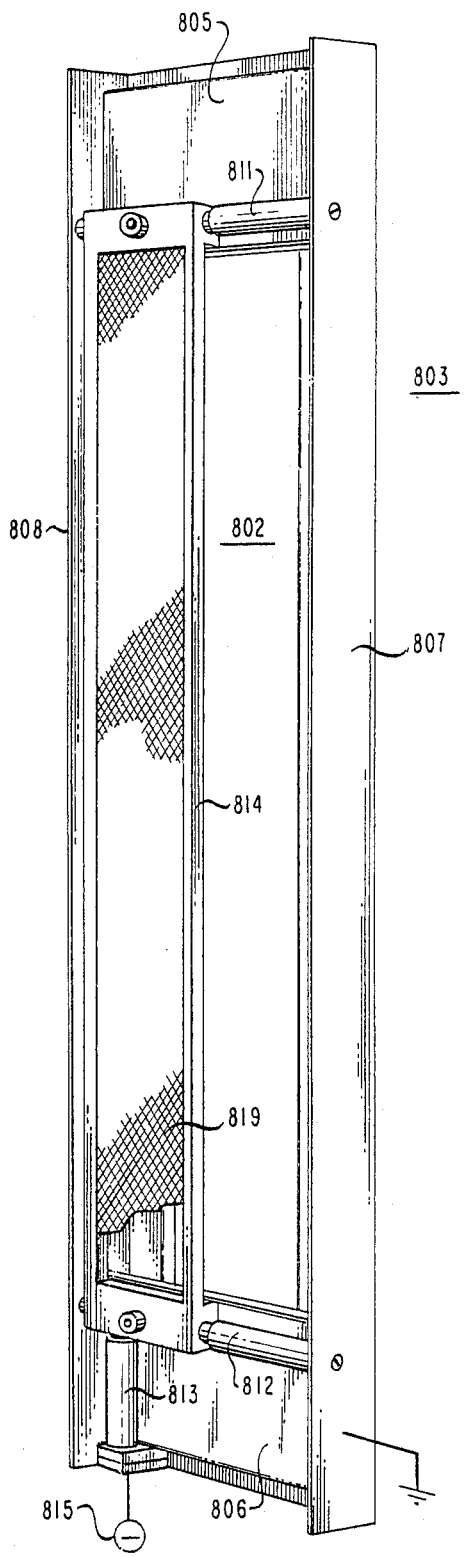
FIG. 8 is a perspective view of a coating source shield having a screen grid attached.

A perspective view of a magnetron shield including an etching screen grid is shown in FIG. 8. The magnetron anode shield unit 803 is a component of every unit including a magnetron coating source and may be seen in cross section in FIG. 4 where it is represented by anode shield 415. The anode shield in the case of a typical coating unit operates to protect much of the sputtering structure from sputtering deposits. The magnetron target surface is located behind the opening 801. This opening in the illustrated shield is limited on one side of the sheild unit by the screen grid frame 814 which supports an electrically energized screen 819 described below. Most of the subsequent anode shield units along the transport track do not include a screen grid.

The anode shield unit 803 is comprised of the sides 807 and 808 whose cross sectional profile is seen in FIG. 4 and which are operational to prevent deposition of the sputtered coating material on portions of the processing apparatus other than the frontal target structure of the magnetron. The top and bottom shield 805 and 806 provide the same protection for the top and bottom of the processing structures. The entire shield unit is placed at ground potential which with the cooling station support systems allows it to function as an anode in the sputtering system.

Situated in front of the target opening 802 and sized to cover its full height and a portion of its exposed width is a screen grid comprising woven wire with the weave of individual wires being at a 45° angle to the horizontal. These wires are electrically charged to a negative potential relative to the shield by the magnetron unit itself acting as a negative voltage source through connection 815. The supports 811, 812 and 813 which are attached to the shield and hold the frame 814 of the screen in place are electrically insulated. A negative potential 815 is applied to the screen through the conductive interior of the support 813. This electrically charged screen grid is operative to neutralize ions and provide a source of electrically neutral atoms to strike the surface of panels on the transport track and both clean and deposit material on the surface of a panel passing by. The individual wires of the screen grid are each positioned at a 45° slope to the horizontal in order to prevent producing a shadow grid pattern on the panel surface as it passes the magnetron etching unit. Wires which are orthogonal to the anode shield's sides could produce a similar etched orthogonal pattern on the surface of the panel due to a concurrence of a wire direction paralleling the direction of panel travel.

Figure 9:
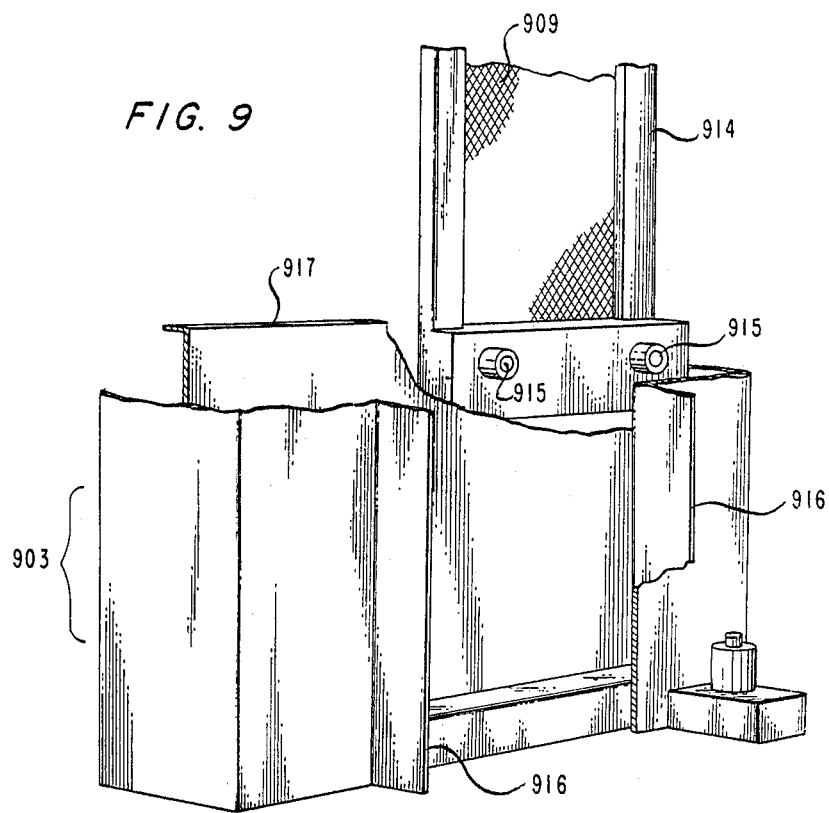
FIG. 9 is a fragmentary view of the coating source shield of FIG. 8 viewed from the opposite direction.

A partial reverse view of the lower portion of the screen grid and anode/shield is shown in FIG. 9. The anode/shield 903 includes the lip 916 (lip 416 in FIG. 4) that is positioned closely to the target surface to control the electron trajectory and assure cooler operation of the substrates being coated. Control of the electron trajectory by using the anode shield as shown limits the number of high energy electrons striking end portions of the magnetron unit as well as sputtering ions having an undesirable trajectory which strike the sides of the magnetron unit itself producing excess heat. A track lip 917 is positioned adjacent to a transport track in order to shield the track mechanism from undue sputter deposition. The screen grid as shown, covers the discharge area of half the magnetron surface in the horizontal direction and as discussed above includes a frame 914 and a grid of woven wire 909 at a 45° weave angle to the horizontal. Insulators 915 isolate this grid from the shield.

Figure 10:
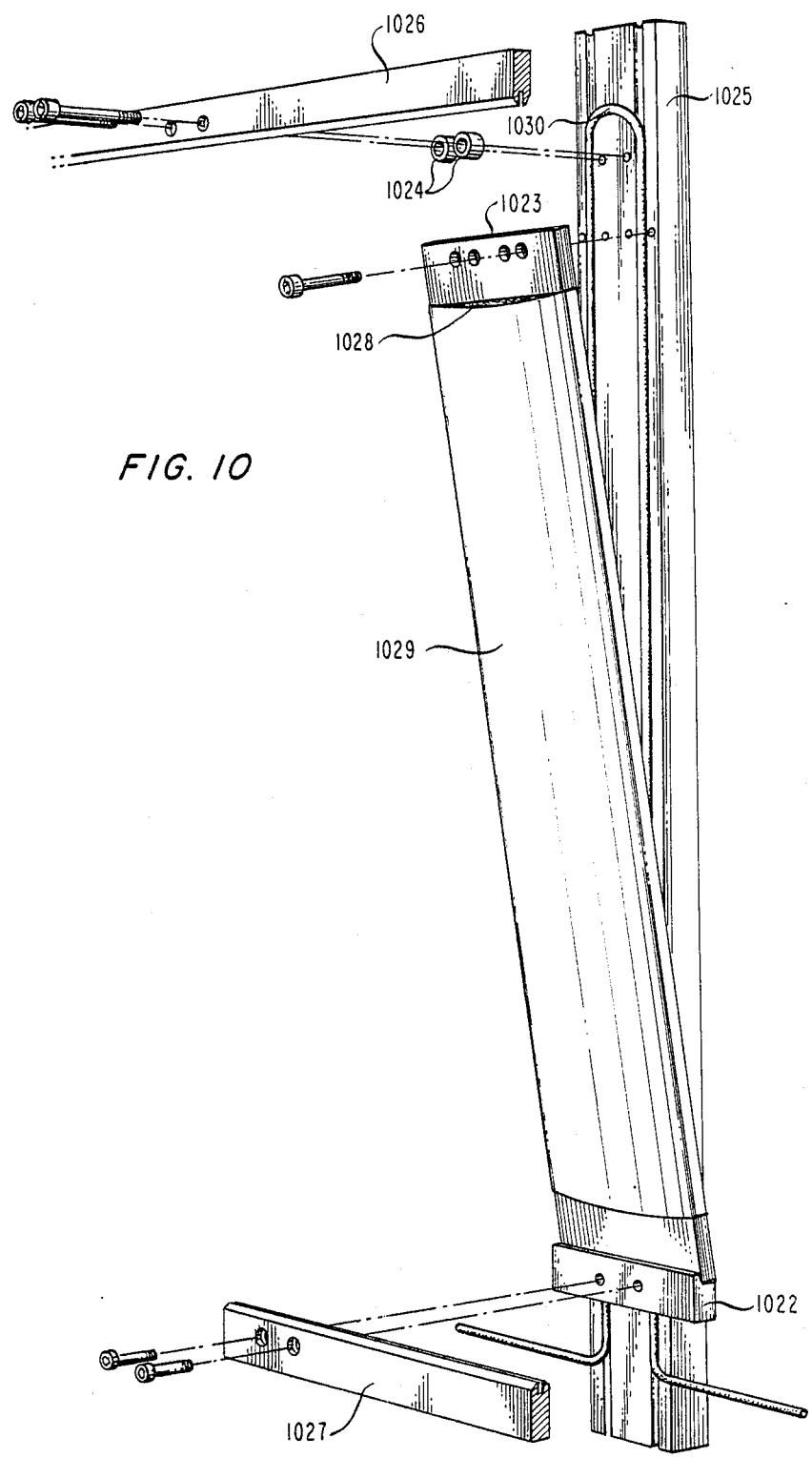
FIG. 10 is an exploded perspective view of a cooling station.

A cooling station support mechanism shown in FIG. 10 includes a support column 1025 and a cooling plate 1023 which bolts onto the support column 1025. A u-shaped water tube 1030 is shown mounted on the surface of the support column 1025 in grooves provided for that purpose. Corresponding grooves (not shown) are cut into the back of the cooling plates, 1023, to accommodate the water tubes. The cooling plates fit into a support member 1022 mounted near the bottom of support column 1025 and is bolted directly to the support column 1025 at the top face of the cooling plate. Cooling plates include a brass sheet cooling surface (1029) which is affixed at the side of plate 1023 and is resiliently mounted to plates 1023 by brass wool 1028 as shown in FIG. 4. This brass wool forces the cooling surface to bow outwardly and overhang the path of panels along the transport tracks. The cooling surface flattens out and rides along the surface of panels passing by. The brass wool provides the necessary spring action to cause bowing of the cooling surface and is a thermal conductive path between cooling surface 1029 and cooling plate 1023. Upper and lower panel transport tracks 1026 and 1027 are bolted to support column 1025 against standoffs 1022 and 1024.

Figure 11:
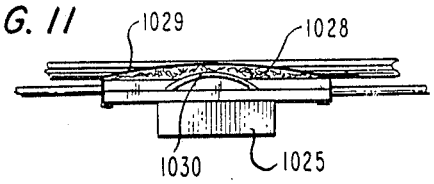
FIGS. 11, 12 and 13 are orthogonal views of the cooling station of FIG. 10.
Figure 12:
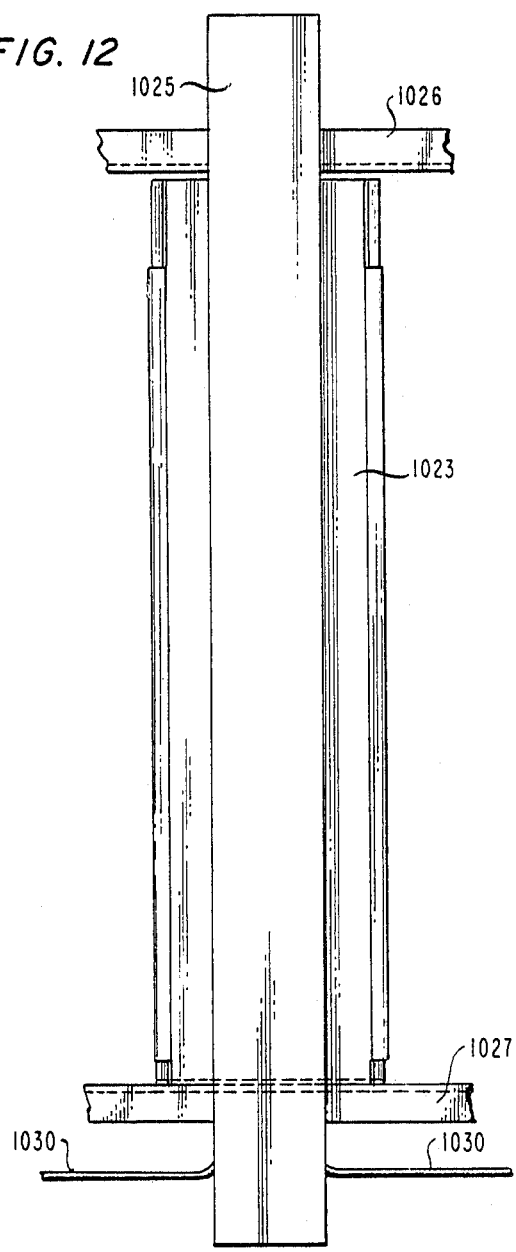
Figure 13:
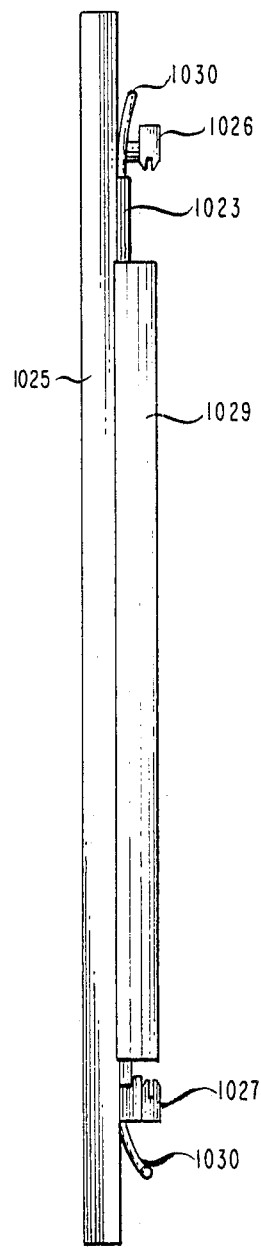

Orthogonal views of the support cooing structure are shown in FIGS. 11, 12 and 13 which show the transport tracks 1026 and 1027 affixed to the support structure and the brass sheet cooling surface 1029 affixed to the front of plate 1023 and extending over the path of the transport tracks. The cooling tube 1030 is bent outside of the plane of the support column 1025 where it reverses direction but is otherwise fitted in grooves shared by the support column 1025 and the cooling plate 1023.

A critical element in the proper functioning of the coating system apparatus is the maintenance of the proper gaseous atmosphere within the processing chamber. Since the chamber is comprised of slab sided walls, the junction points where the various walls meet must be absolutely airtight.

Figure 14:
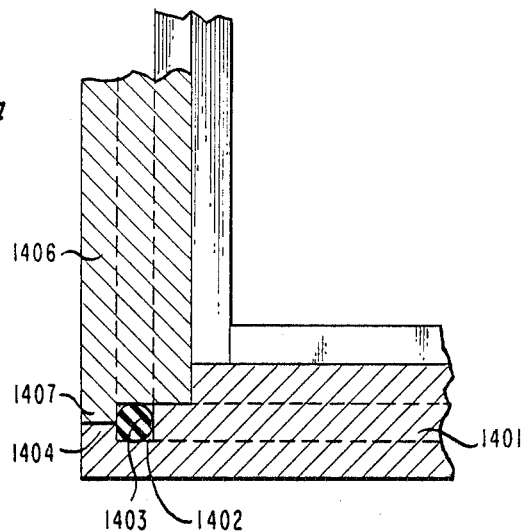
FIGS. 14 and 15 are orthographic views showing details of the construction of seals to isolate the process chamber from the outside atmosphere.

A corner junction at which a side wall meets a supporting floor wall is shown in FIG. 14. The base slat 1401 has a slot 1402 cut into it to accept a rubber sealing filament 1403. The outer portion of wall 1402 of the slab 1401 is cut to a height so that the slot wall at that point (1404) equals the radius of the filament 1403. The side wall 1406 has its end cut to provide an extension 1407 to meet the cut down side 1404. The dimensions are selected so that the height and width of the enclosed slot is slightly less than the outer diameter of the unstressed rubber filament 1403.

Figure 15:
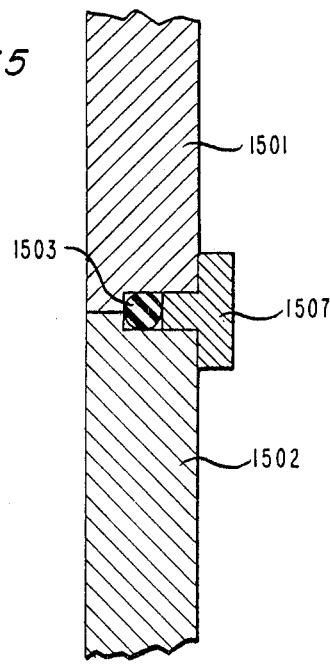

A noncorner junction is shown in FIG. 15 and as shown a deep groove is formed in two adjoined slabs 1501 and 1502 and a rubber filament 1503 is inserted therein. The groove with the included filament 1503 is plugged with a supporting member 1507 so as to compress rubber filament 1503 to provide a vacuum tight seal.

Figure 16:
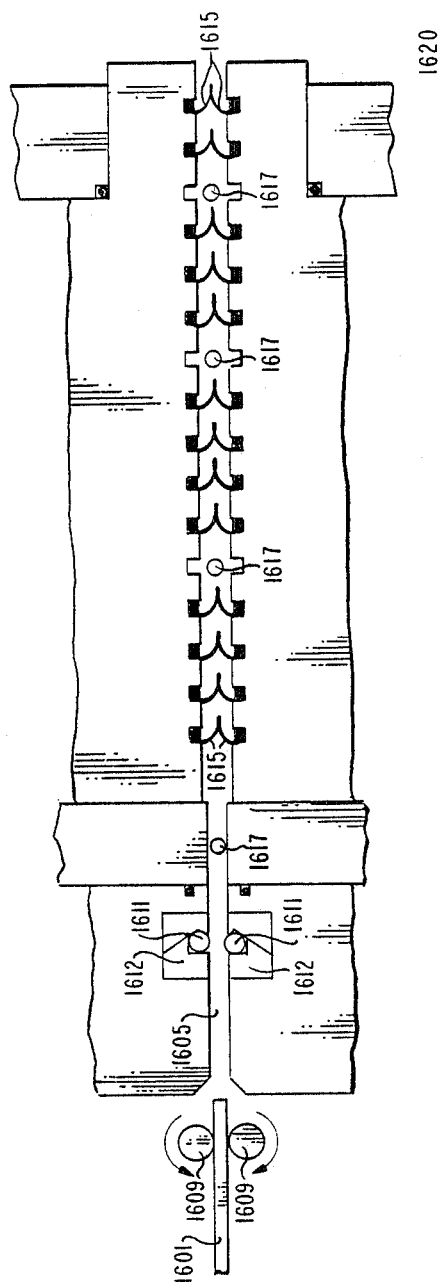
FIG. 16 is a cross section view of a dynamic air lock mechanism suitable for use with the present invention.

An entry dynamic air lock suitable for application in the processing system discussed herein is shown in a cross sectional planar view in FIG. 16. The drive rollers 1609 physically contact the panel 1601 to be processed and drive it along a transport track into the entrance 1605 of the air lock. Since panels are adjacent one another on the transport track, this pushes subsequent panels along the track through the processing system.

Close to the entry part area 1605 are the inlet rolling seals 1611 which as shown are rubberized and circular in cross section. The slot 1612 into which they are fitted has one slot wall shaped with a v shape to permit these rolling seals 1611 to both rotate as the panel passes by and maintain surface contact with slot 1612 and maintain a good gaseous seal while applying very little drag to the panel.

Subsequent to these lip seals 1611 are chevron shaped flexible seals 1615 which ride along a surface of the panel and provide additional sealing isolation between the entry port 1605 and the processing chamber 1620. Interspaced along the transport path in the vicinity of these chevron seals 1615 are vacuum ports 1617 which continuously pump out the portion of the transport path to enhance the low atmospheric pressure therein.

This air lock arrangement is just one of many arrangements in which dynamic air locking is to be achieved. It is not intended to limit the scope of the invention disclosed herein.

What is claimed is:

1. A method of depositing a metallic coating on an article, comprising the steps of:
   evacuating a closed chamber and providing a controlled gaseous environment at low pressure within the closed chamber;
   positioning a plurality of bidirectional targets arranged in a plurality of rows of bidirectional targets with the bidirectional targets in each row being sequentially positioned one after another within the closed chamber, and the rows of bidirectional targets being substantially parallel with one another;
   selectively transporting articles to be metallically coated along a plurality of defined transport paths, with each transport path being located substantially equidistantly intermediate to two adjacent rows of bidirectional targets; and
   generating a magnetic field within the closed chamber which has lines of flux adjacent to a surface of the article which are substantially parallel to the surface of the article by creating opposing magnetic fields with additional magnetic sources located between adjacent bidirectional targets in each row of bidirectional targets and oppositely poled to magnetic sources included with each bidirectinal target in order to minimize article heating and to enhance the sputter yield of the bidirectional targets so that emissions of at least a majority of free metallic atoms from the target have a trajectory that instersects the surface of the article on an adjacent transport path.

2. A method of depositing a metallic coating on an article as defined in claim 1 and comprising the additional step of
   continuously inserting articles into the closed chamber onto the path and continuously removing articles that are coated from the closed chamber without altering pressure or composition of the gaseous atmosphere within the closed chamber.

3. A method of depositing a metallic coating on an article as defined in claim 1 and comprising the additional step of inserting a woven wire screen between at least one of the targets and the transport path in order to electrically neutralize ions attracted to and passing through the screen wherein the neutralized atoms then effect a cleaning action at a surface of the article.

4. A method of depositing a metallic coating on an article as defined in claim 1 and comprising the additional step of arranging for a surface of the article in each trnsport path to have tactile contact with a cooled surface in order to maintain the article below a desired temperature limit.

5. A method of depositing a metallic coating on an article as claimed in claim 1 including the step of:
   providing each of the rows of bidirectional targets and additional magnetic sources with identical magnetic field source orientations at corresponding positions along each row of bidirectional targets.

6. Sputtering apparatus for depositing a metallic coating on an article; comprising:
   a processing chamber adapted for maintaining a low pressure gaseous atmosphere;
   a plurality of targets of a desired metal for coating the article and being arranged sequentially in a plurality of rows of targets,
   the plurality of targets being located within the processing chamber and the plurality of rows of targets being substantially parallel to one another,
   multiple means for transporting articles to receive metallic coatings along selected transport tracks, each track being located substantially equidistantly intermediate to two adjacent rows of targets,
   means adapted for generating a plasma causing atoms to be ejected from a surface of the targets,
   and means adapted for controlling a trajectory of atoms ejected from the targets such that a trajectory path of a majority of the atoms intersects the articles to be coated, each target including a target magnetic source oriented in a first magnetic polarity orientation included within each target,
   the targets being bidirectionally surfaced and adapted to be operative to supply ejected atoms from both sides toward adjacent means for transporting articles, and
   means for inserting articles into and removing articles from the processing chamber while simultaneously maintaining a desired controlled atmosphere within the processing chamber,
   means for magnetically minimizing the heating of the substrates caused by charged particles by the addition of an associated magnetic field source having a second magnetic polarity orientation opposite the first magnetic polarity orientation located between each of the target magnetic sources, and means for physically cooling the substrates.

7. Sputtering apparatus as defined in claim 6 and further including:

means for electrically neutralizing ions in the plasma and ions ejected from the targets associated with at least one means adapted for generating a plasma on each side of the multiple means for transporting articles.

8. Sputtering apparatus as defined in claim 7 wherein said means for electrically neutralizing atoms comprises an electrically charged woven wire grid.

9. Sputtering apparatus as defined in claim 6 and further including a plurality of cooling stations positioned along each of said means for transporting articles and including a heat conducting surface arranged to tactically contact a surface of the article and means for removing heat from the heat conducting surface.

10. Sputtering apparatus as defined in claim 9 wherein said heat conducting surface is a flexible spring loaded surface that in a relaxed mode intercepts a path of the multiple means for transporting articles and in a flexed mode is made conforming to a surface of the article.

11. Sputtering apparatus as defined in claim 6 wherein said means adapted for controlling a trajectory includes means for generating a magnetic field that produces a flux adjacent to the aritcle that is substantially parallel to a surface of the article.

12. Sputtering apparatus for depositing a metallic coating on article as claimed in claim 6 whereby each of the rows of targets have identical magnetic source orientations in corresponding positions.

13. A method of feeding and coating articles with a metallic coating in a continuous process; the method comprising the steps of:

evacuating a closed chamber to a low pressure gaseous atmosphere, continuously feeding a plurality of articles into the closed chamber, continuously transporting articles within the closed chamber along at least a first and second defined path within the closed chamber, sequentially positioning a first plurality of coating sources along a first side of the first defined path, sequentially positioning a second plurality of coating sources along a second side of the first defined path and a first side of the second defined path intermediate the first and second defined path, sequentially positioning a third plurality of coating sources along a second side of the second defined path, each of said coating sources in the first and third plurality of coating sources including a magnetic source oriented in a first magnetic polarity orientation and the second plurality of coating sources each being oriented in a second magnetic polarity orientation, magnetically enhancing the sputtering yield and controlling magnetic flux adjacent surfaces of articles to be substantially parallel to the adjacent surfaces by the addition of a plurality of associated magnetic field sources having a second magnetic polarity orientation opposite the first magnetic polarity orientation and each associated magnetic field source being located between each of the magnetic source included in the coating sources and producing a trajectory of emissions from the first plurality of coating sources optimized to minimize the heating of the transported articles and to produce sputtered metallic atoms from a target of coating material in which a majority of the metallic atoms intersect a first side of the articles transported along the first defined path, magnetically enhancing the sputtering yield and controlling magnetic flux adjcent surfaces of articles to be substantially parllel to the adjacent surfaces by the addition of a plurality of associated magnetic field sources having a first magnetic polarity orientation opposite the second magnetic polarity orientation and each associted magnetic field source being located between adjacent ones of the magnetic source included in the coating source and producing a trajectory of emissions from the second plurality of coating sources optimized to minimize the heating of the transported articles and to produce sputtered metallic atoms from a target of coating material in which a majority of the metallic atoms intersect a first and second side of the articles transported along a second defined path, magnetically enhancing the sputtering yield and controlling magnetic flux adjacent surfaces of articles to be substantially parallel to the adjacent surfaces by the addition of a plurality of associated magnetic field sources having a second magnetic polarity orientation opposite the first magnetic polarity orientation and each associated magnetic field source being located between adjacent ones of the magnetic source included in the coating sources and producing a trajectory of emissions from the third plurality of coating sources optimized tominimize the heating of the transported articles and to produced sputtered metallic atoms from a target of coating material in which a majority of the metallic atoms intersect a first side of the articles transported along the third defined path, continuously removing coated articles from the closed chamber.

14. A method of feeding and coating articles as defined in claim 13 and comprising the additional step of electrically neutralizing ion emissions from at least one pair of oppositely directed coating sources associated with the first and second defined path respectively.

15. A method of feeding and coating articles as defined in claim 13 and comprising the additional step of cooling coated surfaces of the articles by tactically engaging a surface of the article with heat sinking apparatus.

16. A sputter type process system for depositing a metallic coating on circuit panels, comprising:

a sputter chamber, means for maintaining a controlled gaseous atmosphere within the sputter chamber, a first and second airlocking chamber for permitting a continuous throughput type insertion into and removal of circuit panels to and from the sputter chamber, respectively, means for transporting circuit panels through the sputter chamber along a plurality of panel transport tracks substantially parallel to one another, a plurality of magnetron coating sources serially arrayed between each of the panel transport tracks, and along the outside of outer located panel tracks, each magnetron coating source arrayed between panel transport tracks being bidirectional in operation and including, first and second planar cathode surfaces, a magnetic field source for producing lines of flux substantially parallel to the first and second planar cathode surface and substantially neutral at the circuit panel surface and first and second columnar anodes positioned at opposite edges of the first and second planar cathode surfaces respectively and further including an additional magnetic field source associated with each coating source to cooperate with the magnetic field source of each coating source to constrain magnetic flux adjacent a surface of a circuit panel being coated to be parallel to the surface of a circuit panel being coated, and panels traversing the panel transport tracks are metallically coated on both sides.

17. A sputter type process system as defined in claim 16 and further including means for electrically neutralizing atoms sputtered from a magnetron coating source located on each side of each transport track.

18. A sputter type process system as deinfed in claim 16 and further including:

means for removing heat from surfaces of the circuit panels by tactically engaging the surfaces with a cooling source flexibly conforming to the surface of the circuit panels.

19. A processing system for depositing a metallic coating on an article, comprising:

an airtight processing chamber and means adapted for providing a low pressure controlled gaseous atmosphere within the airtight processing chamber, first, second and third serial arrays of coating sources for supplying the metallic coating to be deposited on the articles, the first, second and third serial arrays being substantially parallel to one another, each coating source including a magnetic field source, an electric field source, and first and second planar targets of a desired coating material arranged to supply coating particles in substantially opposing directions that are substantially perpendicular to the first, second and third serial arrays and further including an additional magnetic field source associated with each coating source to cooperate with the magnetic field source to constrain magnetic flux adjacent a surface of an article being coated to be parallel to the surface of an article being coated, first and second article transport tracks substantially parallel to the first, second and third serial arrays, the first article transport track located intermediate to the first and second serial arrays and the second article transport track located intermediate to the second and third serial arrays, the article transport tracks being operative for guiding articles to be coated through the airtight processing chamber, and means for continuously inserting and continuously removing articles into and out of the airtight processing chamber from the first and second article transport tracks without altering the controlled gaseous atmosphere and including means for driving articles along the first and second article transport tracks.

20. A processing system as defined in claim 19 wherein at least the first and second serial arrays each include a source of electrically neutral atoms for sputter cleaning an adjacent side of an article on an adjacent transport track, each source of electrically neutral atoms including a magnetic field source, an electric field source and first and second opposing planar targets, first and second screens between the first and second planar targets and adjacent transport tracks, the first and second screens being at a cathodic electrical potential that electrically neutralizes all sputtered particles passing through it.

21. A processing system as defined in claim 19 wherein at least the first and second serial arrays each include a cooling source, each cooling source including means for sinking heat and means for tactically engaging surfaces of panels and conducting heat from the panels to the means for sinking heat.

22. A processing system as defined in claim 19 and further including an anode/sputter shield associated with each coating source to prevent spurious sputter deposition on processing apparatus and electrically at an anode potential relative to the coating source and including fins spaced close to the targets.

* * * * *